(12) United States Patent
Li et al.

(10) Patent No.: US 7,427,788 B2
(45) Date of Patent: Sep. 23, 2008

(54) MULTI BRIDGE CHANNEL FIELD EFFECT TRANSISTORS WITH NANO-WIRE CHANNELS AND METHODS OF MANUFACTURING THE SAME

(75) Inventors: Ming Li, Gyeonggi-do (KR); Sung-min Kim, Incheon Metropolitan (KR)

(73) Assignee: Samsung Electronics Co., Ltd. (KR)

( * ) Notice: Subject to any disclaimer, the term of this patent is extended or adjusted under 35 U.S.C. 154(b) by 72 days.

(21) Appl. No.: 11/259,473

(22) Filed: Oct. 26, 2005

(65) Prior Publication Data

US 2006/0091481 A1 May 4, 2006

(30) Foreign Application Priority Data

Oct. 28, 2004 (KR) .................. 10-2004-0086555

(51) Int. Cl.
*H01L 29/80* (2006.01)
(52) U.S. Cl. ............... 257/287; 438/206; 257/E21.418; 257/E29.257
(58) Field of Classification Search .................. 438/183, 438/184, 284, 173, 177, 192, 206, 212; 257/401, 257/287, 341
See application file for complete search history.

(56) References Cited

U.S. PATENT DOCUMENTS 6,709,982 B1   3/2004  Buynoski et al.
6,800,910 B2 * 10/2004 Lin et al. .................... 257/410
6,970,373 B2 * 11/2005 Datta et al. ................. 365/154

FOREIGN PATENT DOCUMENTS

JP          06-140636         5/1994
JP          11-008390         1/1999
KR      1020020078996 A      10/2002

OTHER PUBLICATIONS

Notice to Submit Response in Korean Application No. 10-2004-0086555; Date of mailing: May 18, 2006.
English translation of Notice to Submit Response in Korean Application No. 10-2004-0086555; Date of mailing May 18, 2006.

* cited by examiner

*Primary Examiner*—Quoc D Hoang
(74) *Attorney, Agent, or Firm*—Myers Bigel Sibley & Sajovec

(57) ABSTRACT

A field effect transistor (FET) includes spaced apart source and drain regions disposed on a substrate and at least one pair of elongate channel regions disposed on the substrate and extending in parallel between the source and drain regions. A gate insulating region surrounds the at least one pair of elongate channel regions, and a gate electrode surrounds the gate insulating region and the at least one pair of elongate channel regions. Support patterns may be interposed between the semiconductor substrate and the source and drain regions. The elongate channel regions may have sufficiently small cross-section to enable complete depletion thereof. For example, a width and a thickness of the elongate channel regions may be in a range from about 10 nanometers to about 20 nanometers. The elongate channel regions may have rounded cross-sections, e.g., each of the elongate channel regions may have an elliptical cross-section. The at least one pair of elongate channel regions may include a plurality of stacked pairs of elongate channel regions.

19 Claims, 22 Drawing Sheets

MULTI BRIDGE CHANNEL FIELD EFFECT TRANSISTORS WITH NANO-WIRE CHANNELS AND METHODS OF MANUFACTURING THE SAME

CROSS-REFERENCE TO RELATED APPLICATION

This application claims the benefit of Korean Patent Application No. 10-2004-0086555, filed on Oct. 28, 2004, in the Korean Intellectual Property Office, the disclosure of which is incorporated herein by reference in its entirety.

BACKGROUND OF THE INVENTION

The present invention relates to semiconductor devices and methods of manufacturing the same and, more particularly, to field effect transistors (FETs) and methods of manufacturing the same.

As the number of applications of semiconductor devices has increased, demand for highly integrated and/or high-speed semiconductor devices has increased. As the integration of semiconductor devices has increased, design rule has tended to decrease, e.g., channel lengths and channel widths of MOS (metal-oxide-semiconductor) transistors have decreased.

When channel length decreases, a short channel effect can occur, and when the channel width decreases, a narrow width effect can occur. Short channel effect refers to a breakdown of a channel region when a potential is applied between source and drain regions. Narrow channel effect refers to an increase in a threshold voltage due to a reduction of the width of a channel region. Various different structures for MOS transistors have been proposed to reduce short channel effect and narrow width effect.

An example of a proposed MOSFET is a MOS transistor having a fin structure as disclosed in U.S. Pat. No. 6,413,802, issued to Chenming Hu, entitled "FinFET Transistor Structures Having a Double Gate Channel Extending Vertically from a Substrate and Methods of Manufacture". Another example is a MOS transistor having a fully depleted lean-channel transistor (DELTA) structure as disclosed in U.S. Pat. No. 4,996,574, issued to Shirasaki, entitled "MIS Transistor Structure for Increasing Conductance between Source and Drain Regions". Another example is a MOS transistor having a Gate All Around (GAA) structure as disclosed in U.S. Pat. No. 6,605,847, issued to Kim et al., entitled "Semiconductor Device Having Gate All Around Type Transistor and Method of Forming the Same".

The aforementioned MOS transistors each have merits and demerits, some of which are described in U.S. Patent Publication No. 20040063286, entitled "Field Effect Transistors Having Multiple Stacked Channels", assigned to the assignee of the present application. U.S. Patent Publication No. 20040063286, incorporated by reference herein in its entirety, proposes a MOS transistor having a structure that solves the demerits of the proposed MOS transistor examples. The MOS transistor has a multi bridge channel (MBC) structure in which multiple channels are vertically stacked and separated from one another. Because a MOS transistor having such an MBC structure may have a reduced area occupied by source and drain regions, such a MOS transistor may be favorable for high integration. Because such a MOS transistor may maintain a substantially uniform source and drain junction capacitance regardless of a location of a channel, such a MOS transistor may be used to manufacture high-speed and highly reliable semiconductor devices.

The above-described MOS transistors having a fin channel structure, a DELTA channel structure, a GAA channel structure, and an MBC channel structure may have limits with regard to high-speed operations. In a MOS transistor having an MBC structure, a cross-section of a channel layer surrounded by a gate electrode typically has the form of a rectangle having a greater horizontal extent than vertical extent. Due to such a cross-section, a higher voltage may be applied to the channel layer by the gate electrode in the vertical direction than in the horizontal direction. When different voltages are applied to the channel layer by the gate electrode in different directions, carriers (e.g., electrons) flowing through the channel layer generally go upward or downward instead of in a straight line. Accordingly, the probability that the carriers will impact with particles constituting the channel layer generally increases. Scattering occurs due to such impacts and, consequently, a speed of electrons flowing to a source and drain region via the channel layer may decrease. Thus, a semiconductor device including the conventional MOS transistor having the MBC structure may not operate desirably at high speed. This problem may also occur in MOS transistors having the other aforementioned channel structures.

In addition, there may be a limit to the number of spaced channel layers that may be included in a conventional MOS transistor having an MBC structure due to limits on etching depth that can be achieved during dry etching. The limit to the number of channel layers may prevent improvement of the performance and reliability of an MBC MOS transistor.

SUMMARY OF THE INVENTION

In some embodiments of the present invention, a field effect transistor (FET) includes spaced apart source and drain regions disposed on a substrate and at least one pair of elongate channel regions (e.g., "wire channel regions") disposed on the substrate and extending in parallel between the source and drain regions. A gate insulating region surrounds the at least one pair of elongate channel regions, and a gate electrode surrounds the gate insulating region and the at least one pair of elongate channel regions. Support patterns may be interposed between the semiconductor substrate and the source and drain regions. The elongate channel regions may have sufficiently small cross-section to enable complete depletion thereof. For example, a width and a thickness of the elongate channel regions may be in a range from about 10 nanometers to about 20 nanometers. The elongate channel regions may have rounded cross-sections, e.g., each of the elongate channel regions may have an elliptical cross-section. The at least one pair of elongate channel regions may include a plurality of stacked pairs of elongate channel regions.

In some method embodiments of the present invention, an FET is fabricated by forming an active region on a substrate, the active region including spaced-apart source and drain regions and at least one pair of elongate channel regions extending in parallel therebetween. A gate insulating region is formed surrounding the at least one pair of elongate channel regions. A gate electrode is formed surrounding the gate insulating region and the at least one pair of elongate channel regions. Forming the active region may include forming the source and drain regions and the at least one pair of elongate channel regions from the same semiconductor material layer.

In further embodiments of the present invention, forming an active region includes forming a stack of layers including n sacrificial layers and n semiconductor layers alternately stacked on a semiconductor substrate, forming a mask pattern defining an active region on the stack of layers, and etching the stack of layers using the mask pattern as an etch mask to form a stack of patterns including n sacrificial patterns and n semiconductor patterns. Each of the sacrificial patterns and the semiconductor patterns including a narrow region extending between wider spaced-apart regions. The sacrificial patterns are etched such that portions of the sacrificial patterns underlying narrow regions of the semiconductor patterns are removed and portions of the sacrificial patterns below the wider regions remain to form n pairs of active support patterns. A first buffer layer is formed that surrounds the active support patterns, the semiconductor patterns and the mask pattern and that leaves an upper surface of the mask pattern exposed. The mask pattern and the first buffer layer are patterned to form a dummy gate pattern exposing surfaces of the wider spaced-apart regions of one of the semiconductor patterns. A second buffer layer is formed that surrounds the dummy gate pattern and leaves an upper surface of the dummy gate pattern exposed. The patterned mask pattern is removed from the dummy gate pattern to form a hole exposing a top surface of the narrow region of the one of the semiconductor patterns, and the narrow region of the one of the semiconductor patterns is etched through the hole to form a pair of elongate channel regions.

In further embodiments, the sacrificial layers include single crystal silicon germanium and the semiconductor layers include single crystal silicon. Each of the semiconductor layers may have a thickness in a range from about 15 nanometers to about 25 nanometers.

According to some embodiments, side surfaces of the mask pattern are etched after the forming the stack of patterns. During forming of the stack of patterns, the semiconductor substrate may also be etched using the mask pattern to form a trench in the semiconductor substrate. During the forming of the first buffer layer, an insulating region may be formed in the trench.

In additional embodiments of the present invention, a sidewall spacer is formed on a sidewall of the first buffer layer and the second buffer layer exposed through the hole after the forming the hole. Etching the narrow region of the one of the semiconductor patterns through the hole to form a pair of elongate channel regions includes etching the narrow region of the one of the semiconductor patterns through the hole to form a pair of elongate channel regions using the sidewall spacer as an etch mask. The first buffer layer and the second buffer layer may include silicon oxide and the sidewall spacer may include silicon nitride. The sidewall spacer may be removed before the removing the second buffer layer and the patterned first buffer layer.

In additional embodiments, side surfaces of the elongate channel regions may be etched before the forming the gate insulating layers. The elongate channel regions may be thermally oxidized to round the elongate channel regions before the forming the gate insulating layers.

Some embodiments of the present invention may provide multi bridge channel field effect transistor (FET) in which short channel effect and a narrow channel effect do not occur and a method of manufacturing the multi bridge channel FET. Some embodiments of the present invention also provide a multi bridge channel FET that can be operated at a high speed and a method of manufacturing the multi bridge channel FET. Some embodiments of the present invention also provide a multi bridge channel FET having the merits of a conventional multi-bridge channel transistor, a GAA transistor, and a DELTA transistor and a method of manufacturing the multi bridge channel FET.

According to some aspects of the present invention, a multi bridge channel FET may be provided including: a semiconductor substrate; a first active pattern separated from a top surface of the semiconductor substrate and including: a pair of source and drain patterns which are separated from each other; and a pair of wire channel patterns which are interposed between the pair of source and drain patterns, separated from each other and arranged parallel in a horizontal direction; gate insulating layers surrounding the pair of wire channel patterns on outer surfaces of the pair of wire channel patterns; and a gate electrode interposed between the pair of source and drain patterns so as to surround the gate insulating layers. The multi bridge channel FET may further include active support patterns interposed between the semiconductor substrate and the source and drain patterns to support the first active pattern. The wire channel patterns may have narrow widths and are thin such that the wire channel patterns can be completely depleted. Both the width and the thickness of the wire channel patterns may be 10-20 nanometers. Each of the wire channel patterns may have an elliptical cross-section. The multi bridge channel FET may further include a second active pattern having the same shape as the first active pattern and separated from a top surface of the first active pattern by a predetermined distance.

According to further aspects of the present invention, a method of manufacturing a multi bridge channel FET includes: forming an active-region-forming stack of layers including n sacrificial layers and n pre-active layers alternately stacked on a semiconductor substrate; forming a mask pattern defining an active region on the active-region-forming stack of layers; etching the active-region-forming stack layer using the mask pattern as an etch mask to form an active-region-forming stack of patterns which includes n sacrificial patterns and n pre-active patterns, each of the pre-active pattern including source and drain patterns and a pre-channel interposed between the source and drain patterns; etching the sacrificial patterns such that portions of the sacrificial patterns below the pre-channel patterns are removed and portions of the sacrificial patterns below the source and drain patterns remain, to form n pairs of active support patterns; forming a first buffer layer which surrounds the active support patterns, the pre-active patterns, and the mask pattern and exposes a top surface of the mask pattern; patterning the mask pattern and the first buffer layer to form a dummy gate pattern exposing top surfaces of the source and drain patterns of the pre-active pattern; forming a second buffer layer which surrounds the dummy gate pattern and exposes a top surface of the dummy gate pattern; removing the patterned mask pattern from the dummy gate pattern to form a hole exposing a top surface of the pre-channel pattern; etching the pre-channel pattern through the hole to form a pair of wire channel patterns; removing the second buffer layer and the patterned first buffer layer from the resultant structure; forming gate insulating layers surrounding the wire channel patterns on outer surfaces of the wire channel patterns; and forming a gate electrode on the gate insulating layers.

n may be 1 or 2. The sacrificial layers may be composed of single crystal silicon germanium and the pre-active layers are composed of single crystal silicon. Each of the pre-active layers may have a thickness of about 15-25 nanometers. The method may further include etching side surfaces of the mask pattern after forming the active-region-forming stacked patterns. During the forming of the active-region-forming stack pattern, the semiconductor substrate may be simultaneously etched using the mask pattern to form a trench in the semiconductor substrate; and, during the forming the first buffer layer, a trench filling-insulating layer for isolating devices may be simultaneously formed. The method may further include forming a sidewall spacer on sidewalls of the first buffer layer and the second buffer layer exposed through the hole, after the forming the hole; and wherein, in the forming the pair of wire channel patterns, the sidewall spacer is used as an etch mask. The first buffer layer and the second buffer layer may include silicon oxide and the sidewall spacer may include silicon nitride. The method may further include removing the sidewall spacer before the removing the second buffer layer and the patterned first buffer layer. The method may further include etching side surfaces of the wire channel patterns, before the forming the gate insulating layers. The method may further include thermally oxidizing the wire channel patterns to round the wire channel patterns before the forming the gate insulating layers.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS

Figure 1:
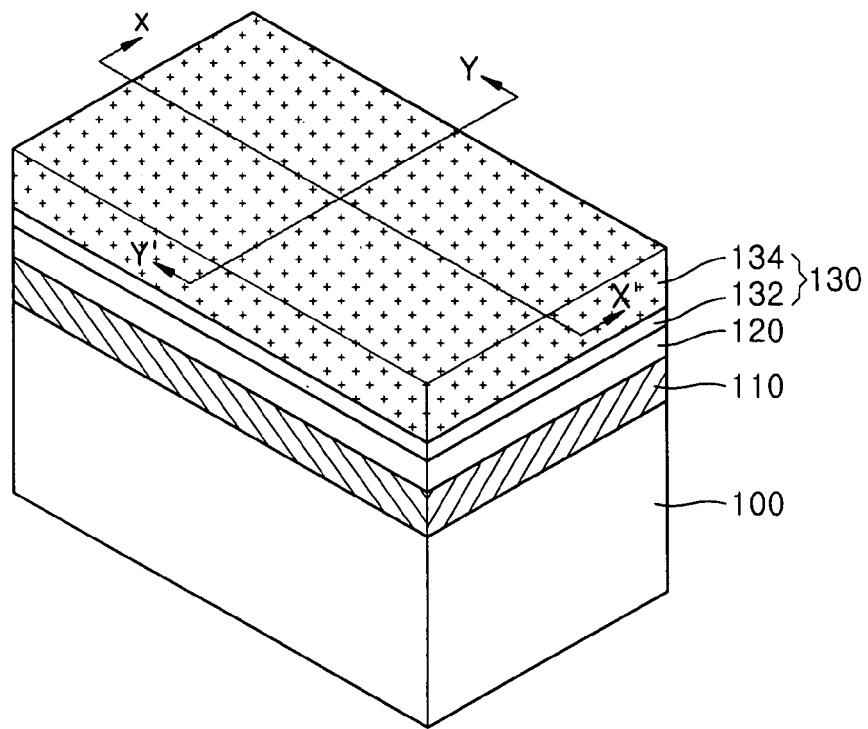
FIGS. 1, 2A, 3A, . . . , and 12A are perspective views illustrating a multi bridge channel field effect transistor (FET) including a plurality of nano-wire bridge channels and operations for fabrication thereof according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the Figures. For example, if the device in the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

Figure 2A:
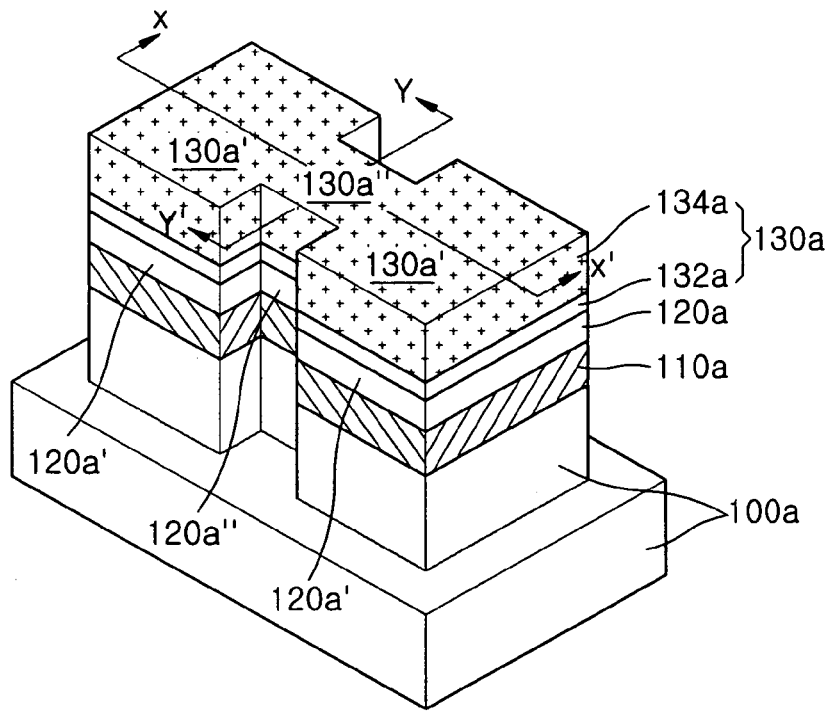
Figure 2B:
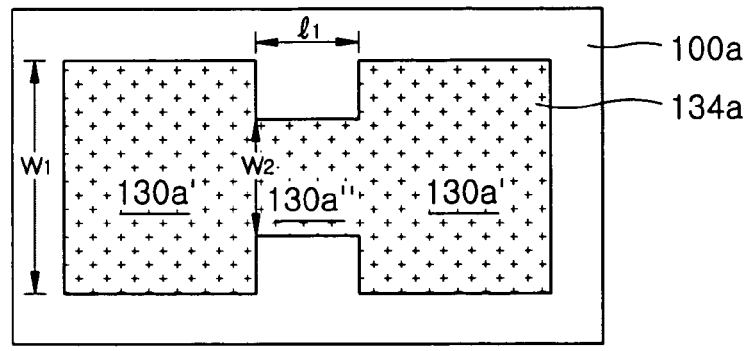
FIGS. 2B, 3B, . . . , and 12B are top views illustrating the operations illustrated in FIGS. 2A, 3A, . . . , and 12A, respectively.
Figure 2C:
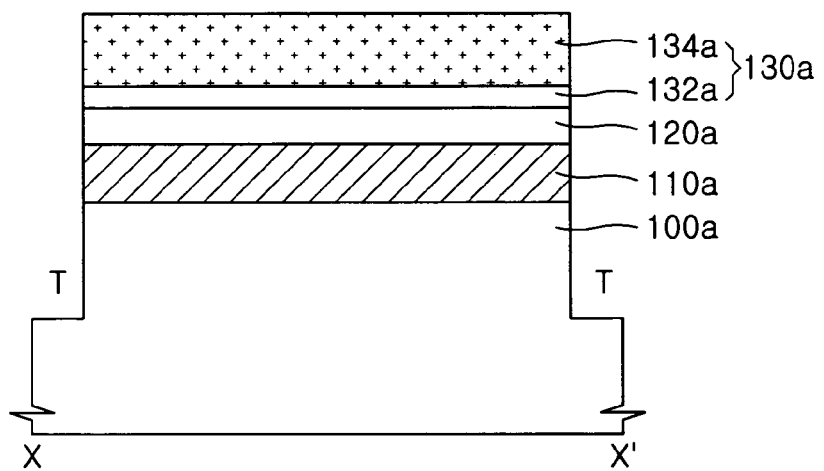
FIGS. 2C, 3C, . . . , and 12C are cross-sectional views taken along lines X-X' of FIGS. 2A, 3A, . . . , and 12A, respectively.
Figure 2D:
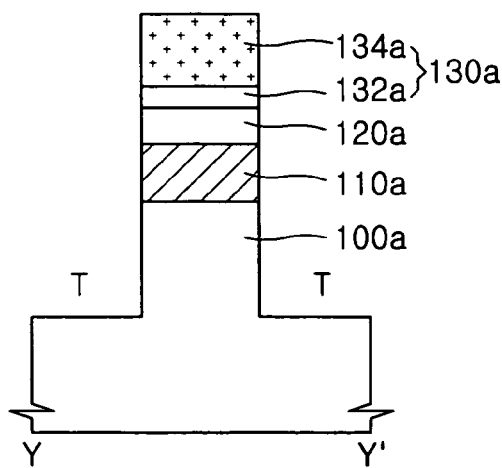
FIGS. 2D, 3D, . . . , 12D are cross-sectional views taken along lines Y-Y' of FIGS. 2A, 3A, . . . , and 12A, respectively.
Figure 3A:
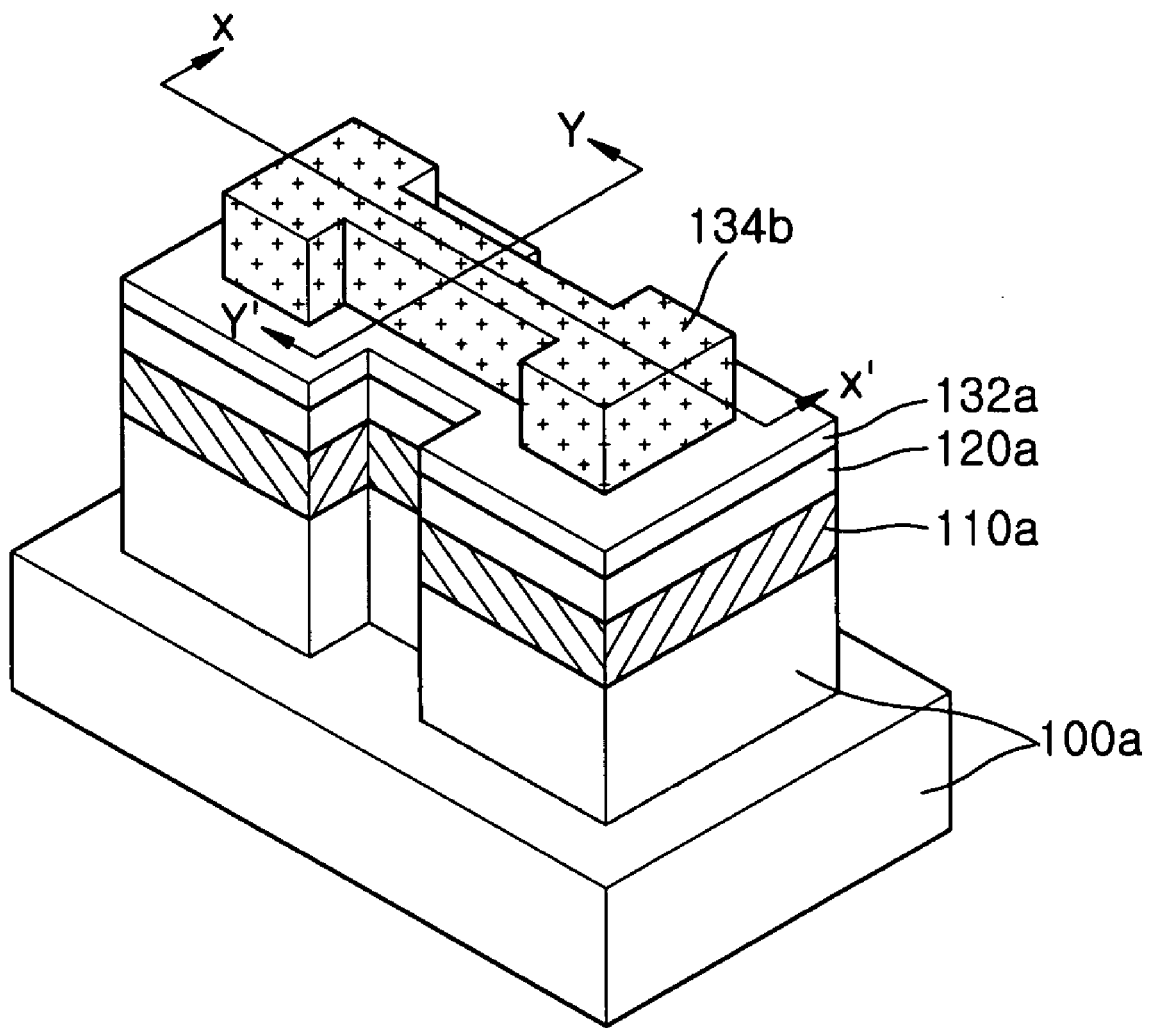
Figure 3B:
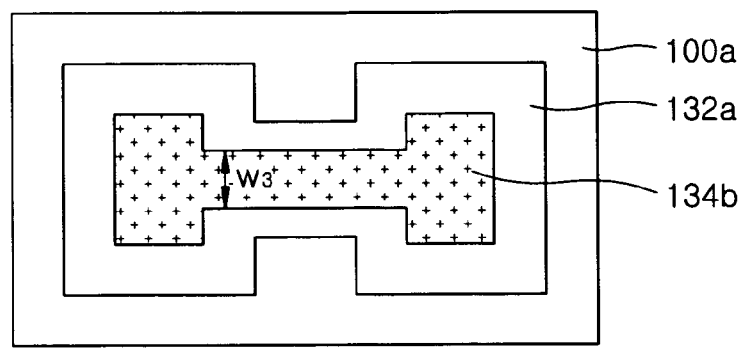
Figure 3C:
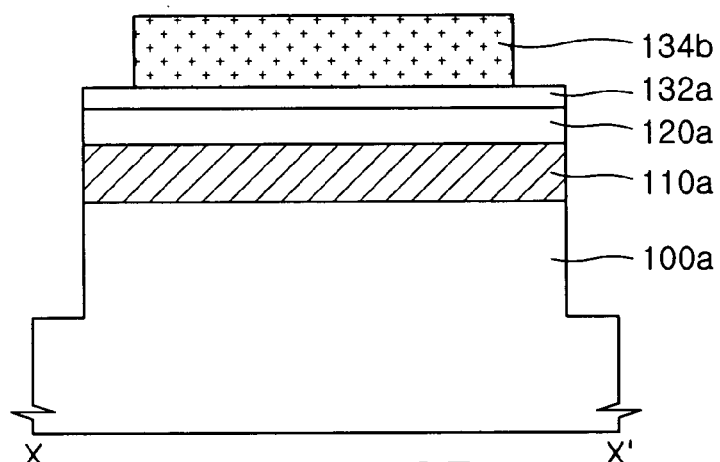
Figure 3D:
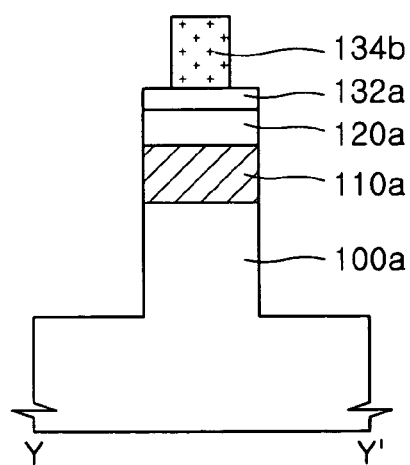
Figure 4A:
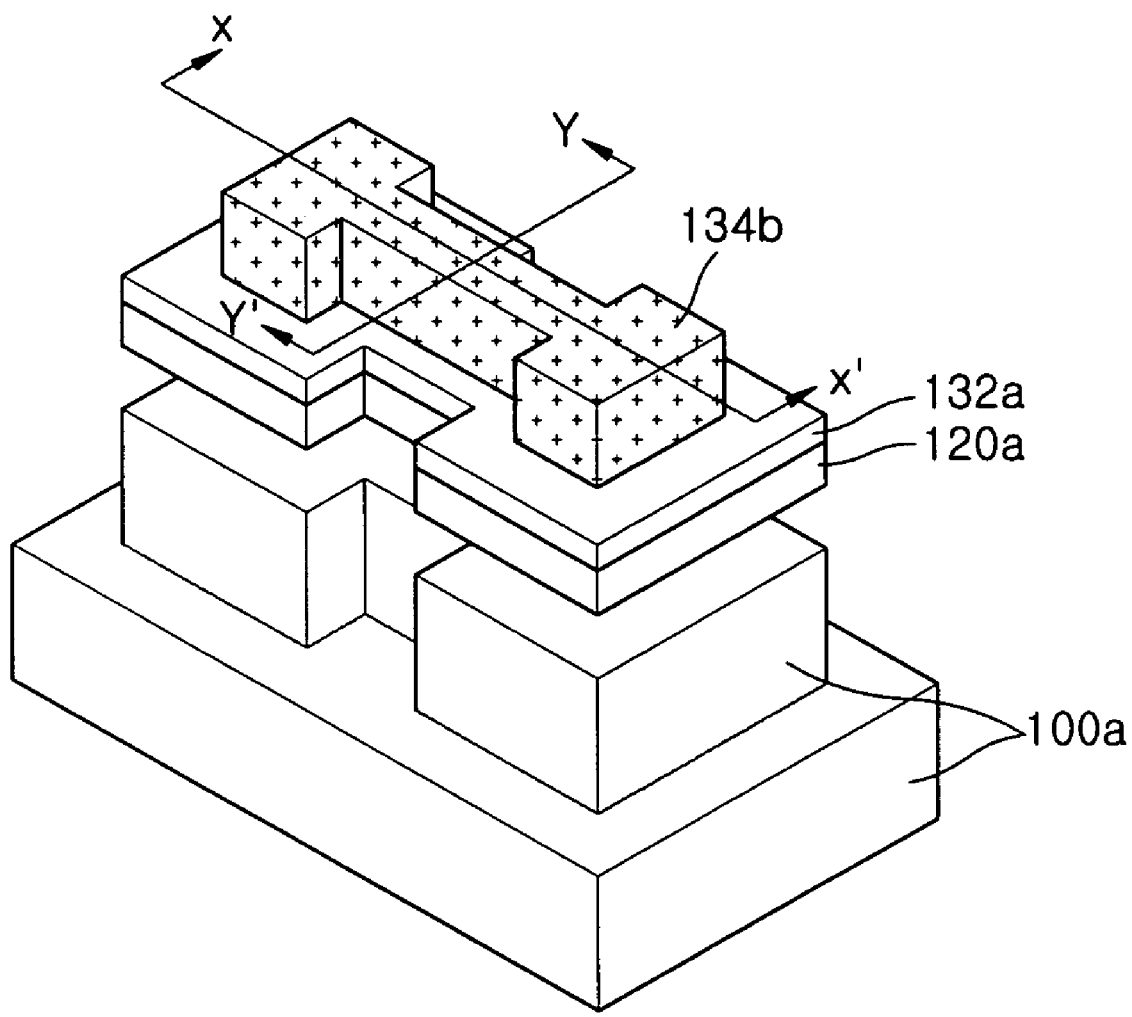
Figure 4B:
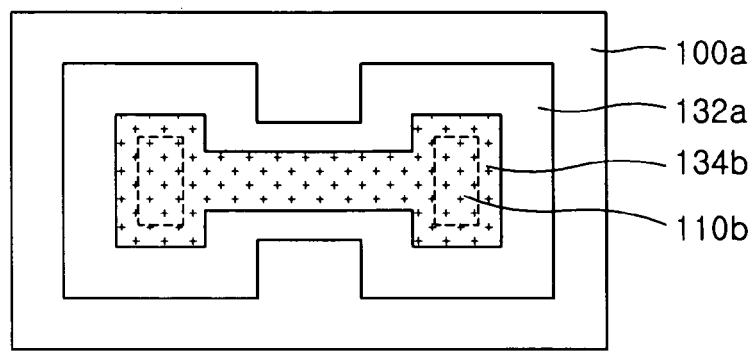
Figure 4C:
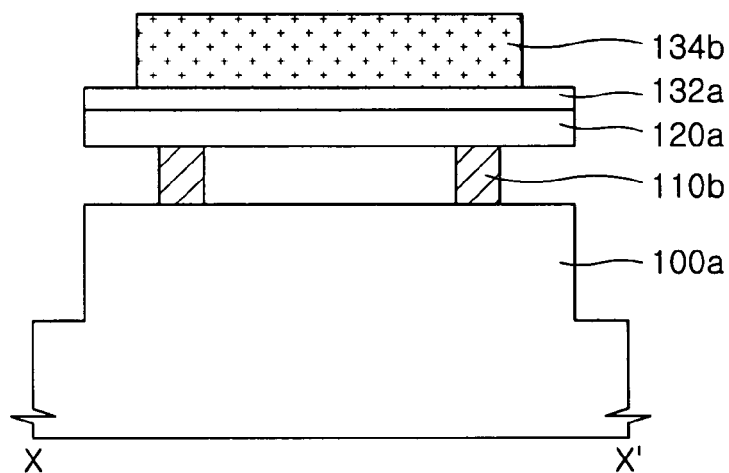
Figure 4D:
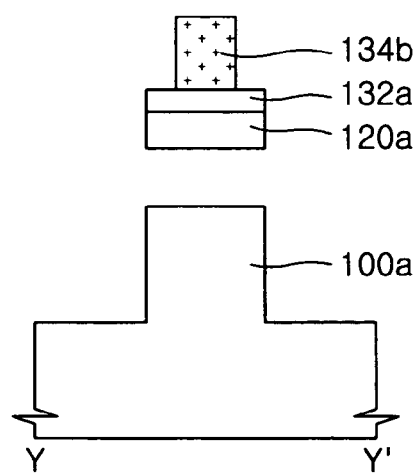
Figure 5A:
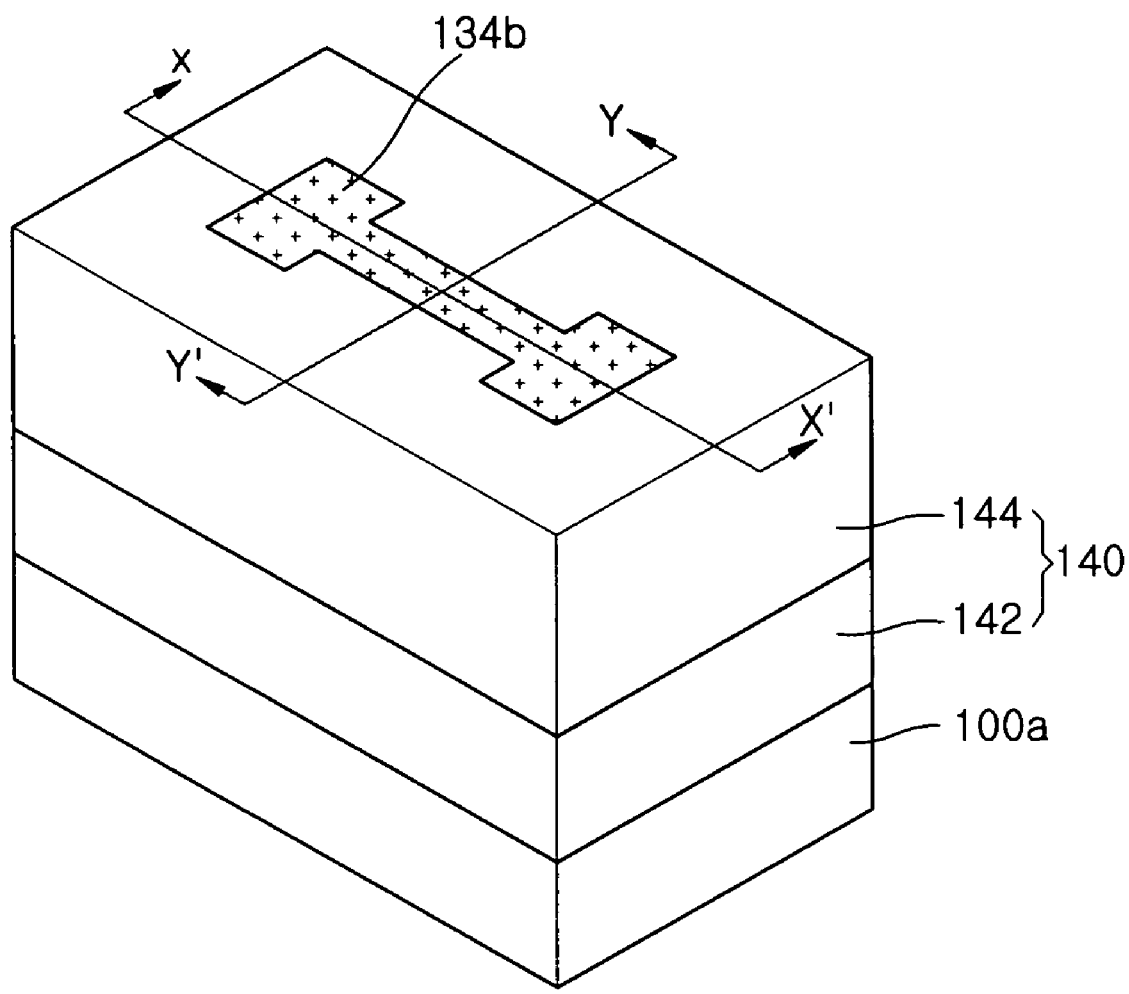
Figure 5B:
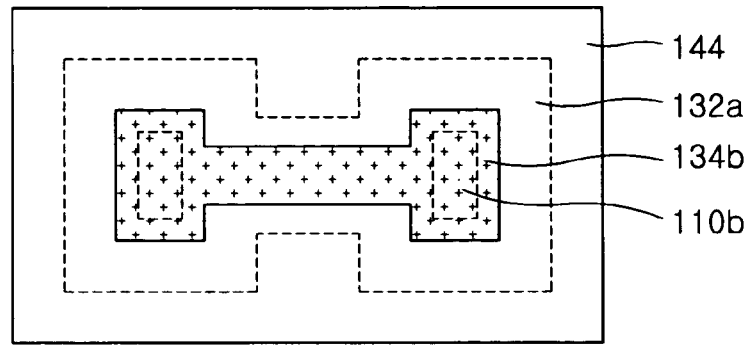
Figure 5C:
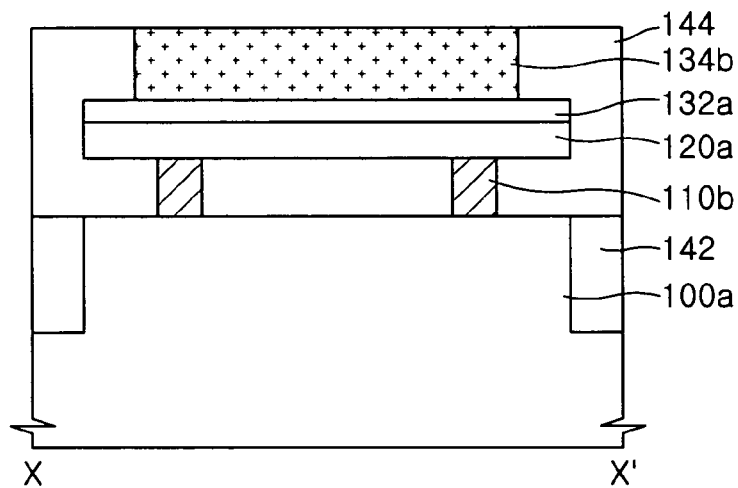
Figure 5D:
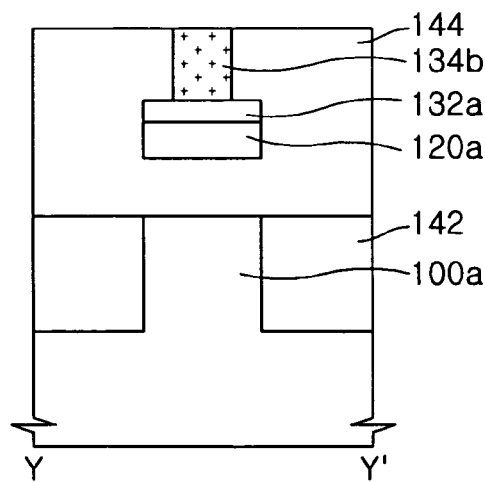
Figure 6A:
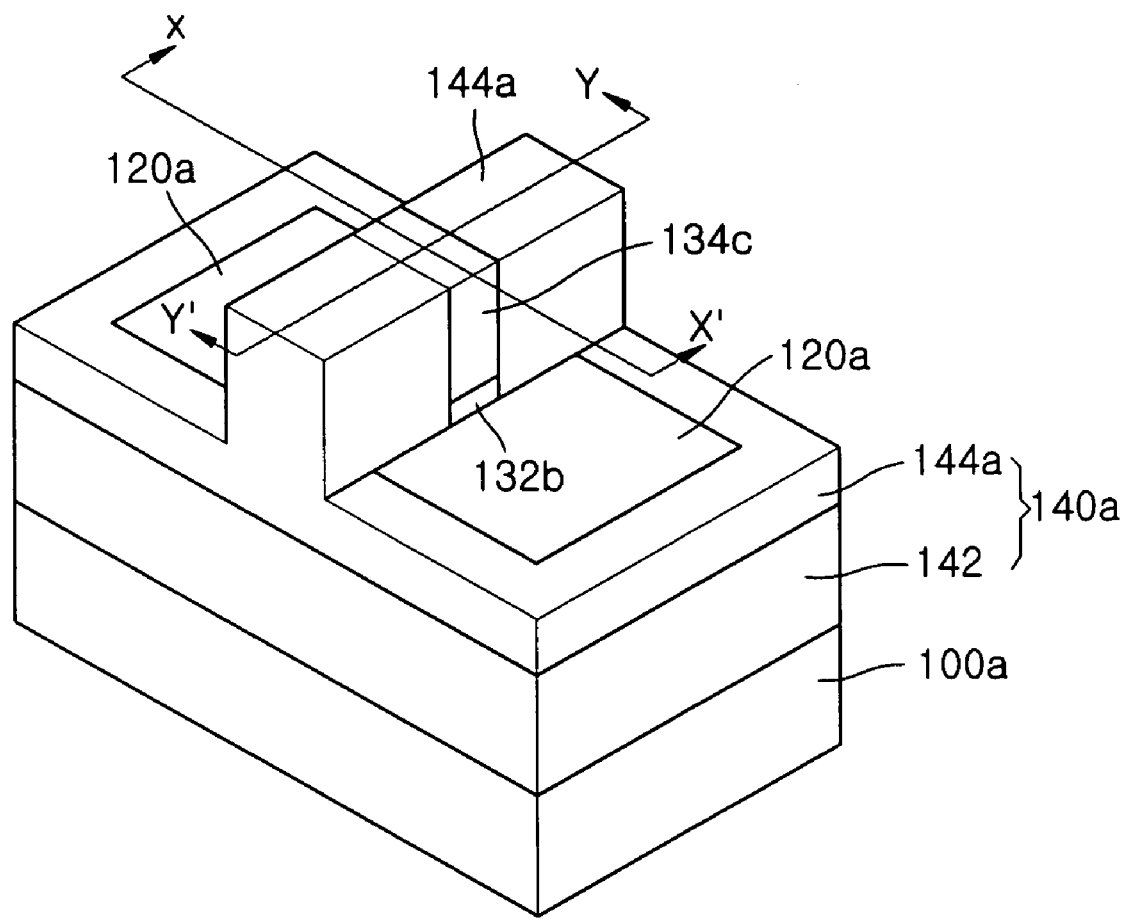
Figure 6B:
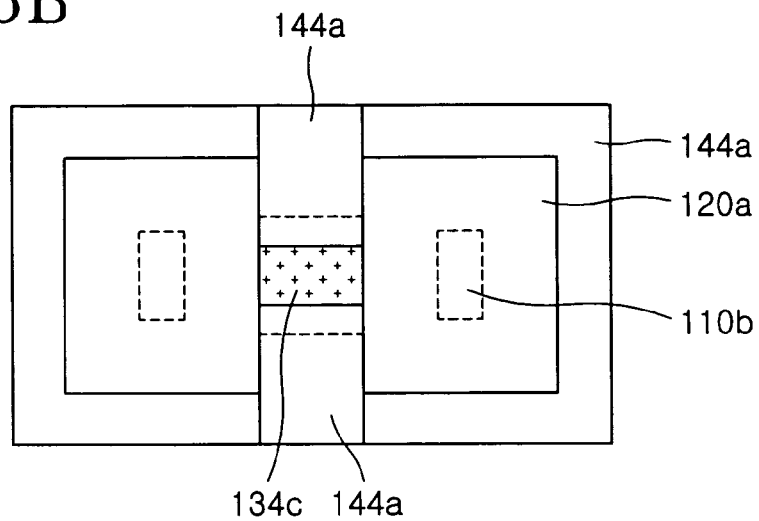
Figure 6C:
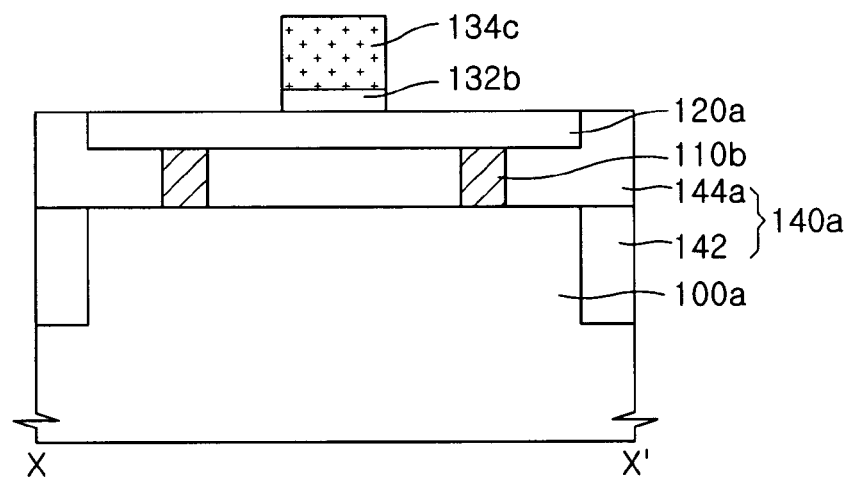
Figure 6D:
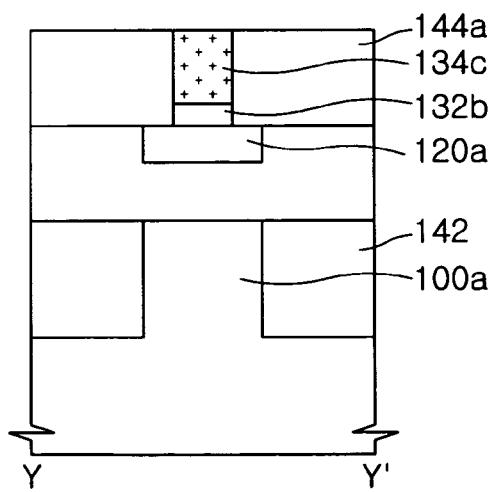
Figure 7A:
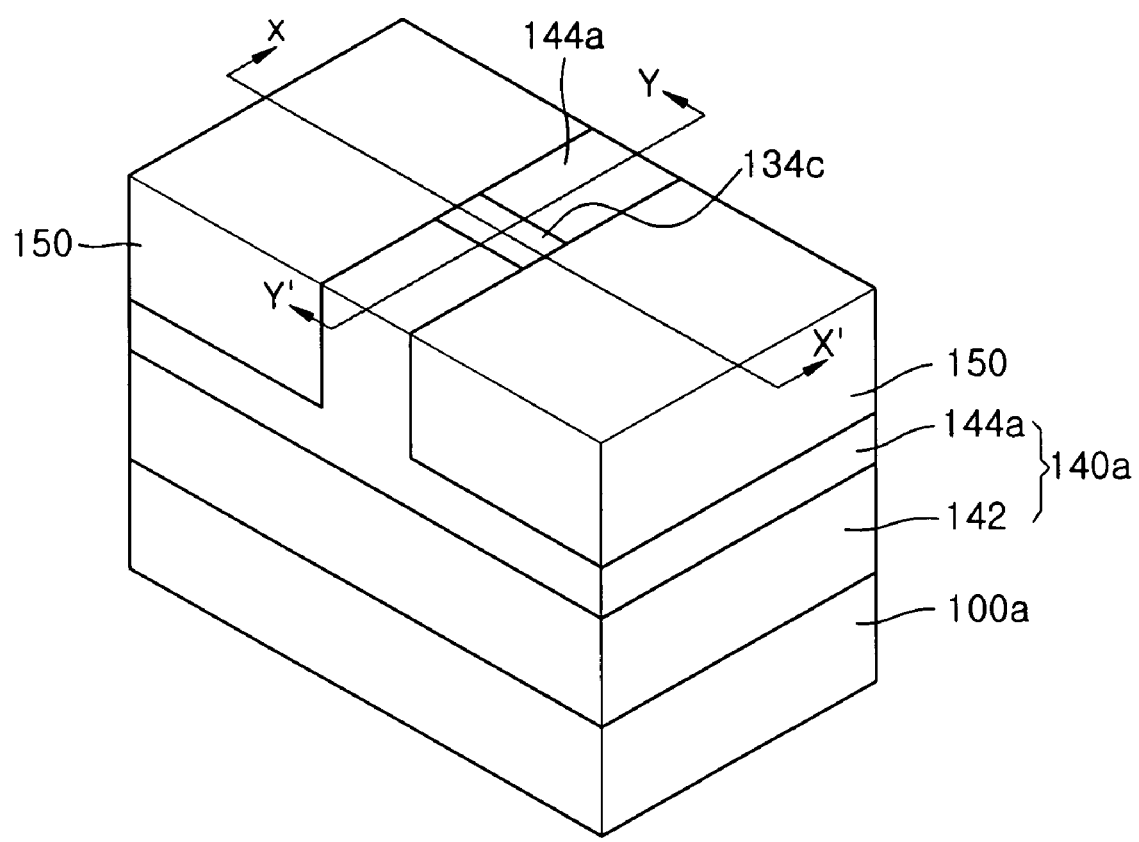
Figure 7B:
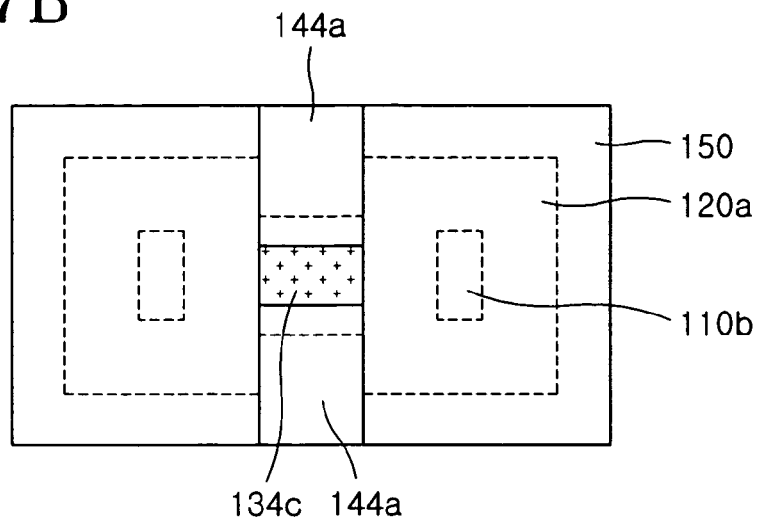
Figure 7C:
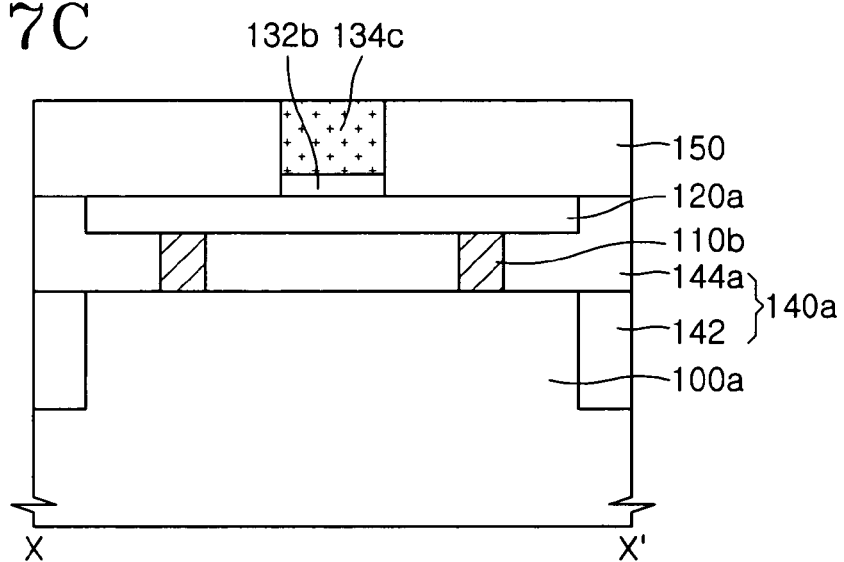
Figure 7D:
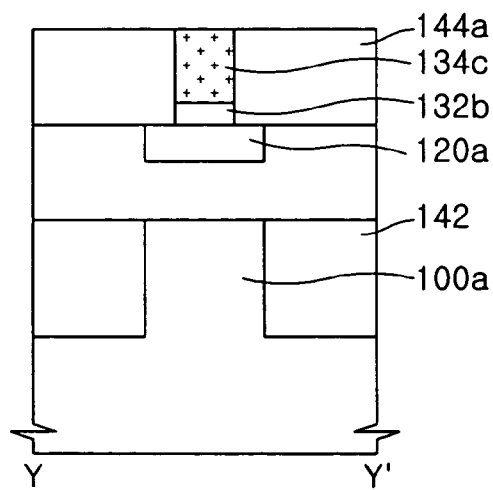
Figure 8A:
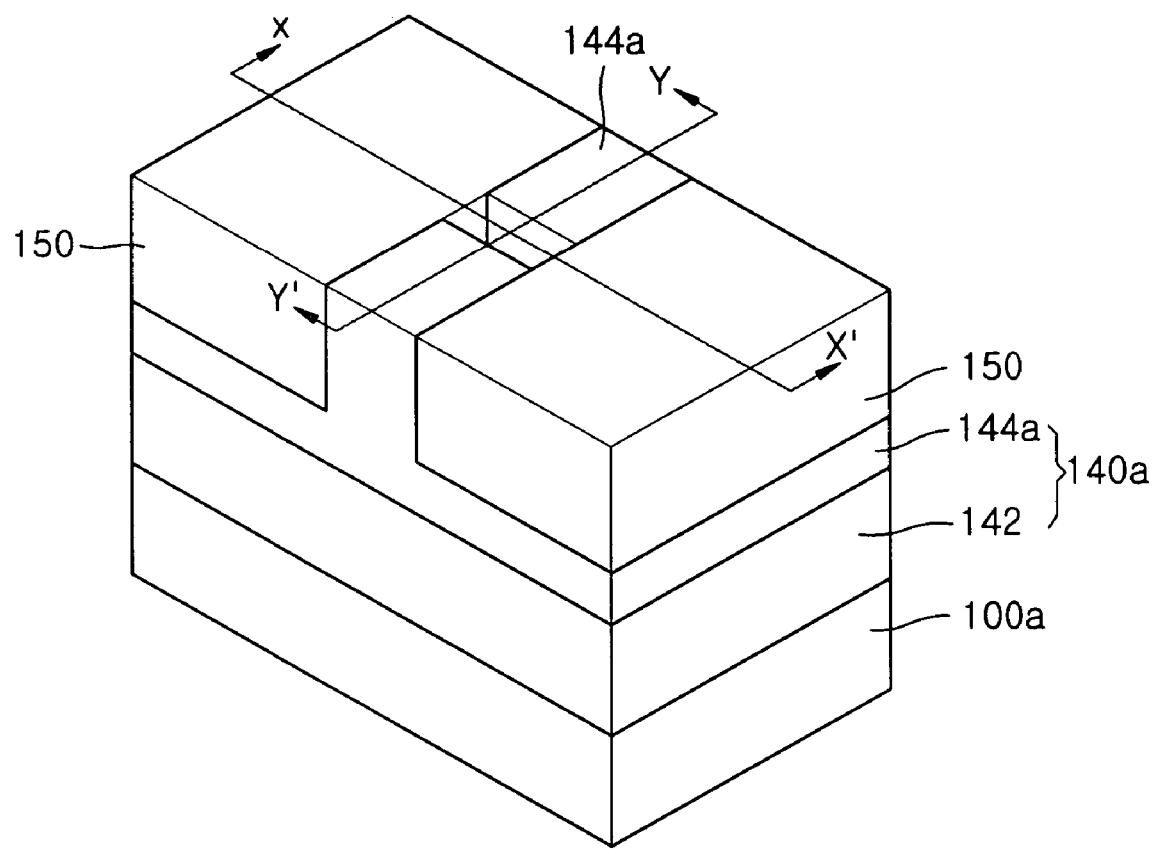
Figure 8B:
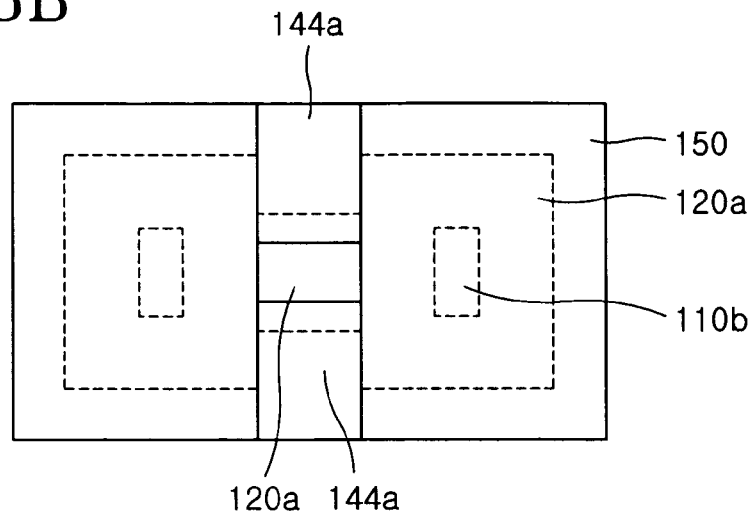
Figure 8C:
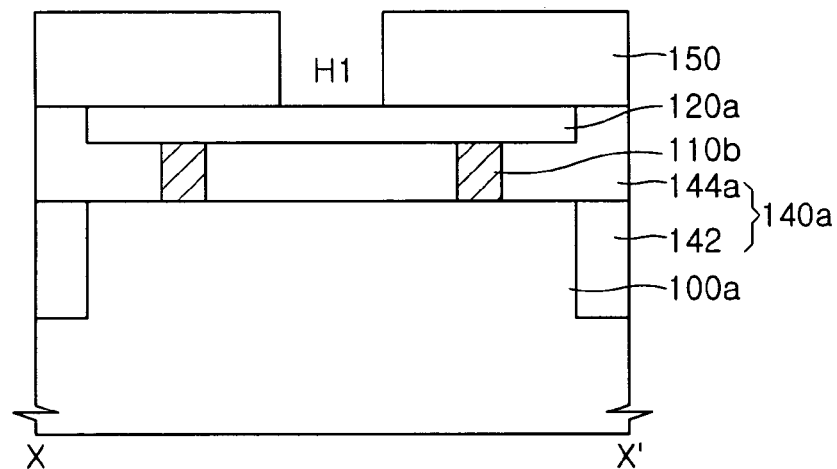
Figure 8D:
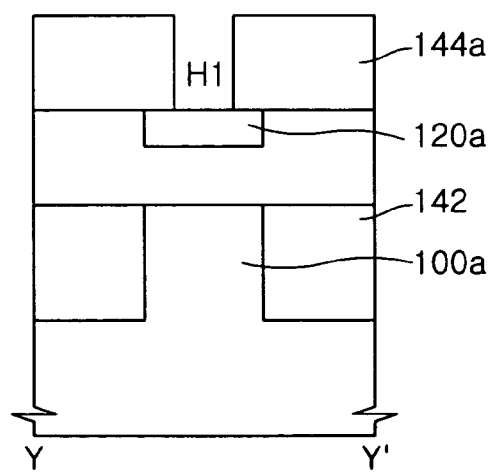
Figure 9A:
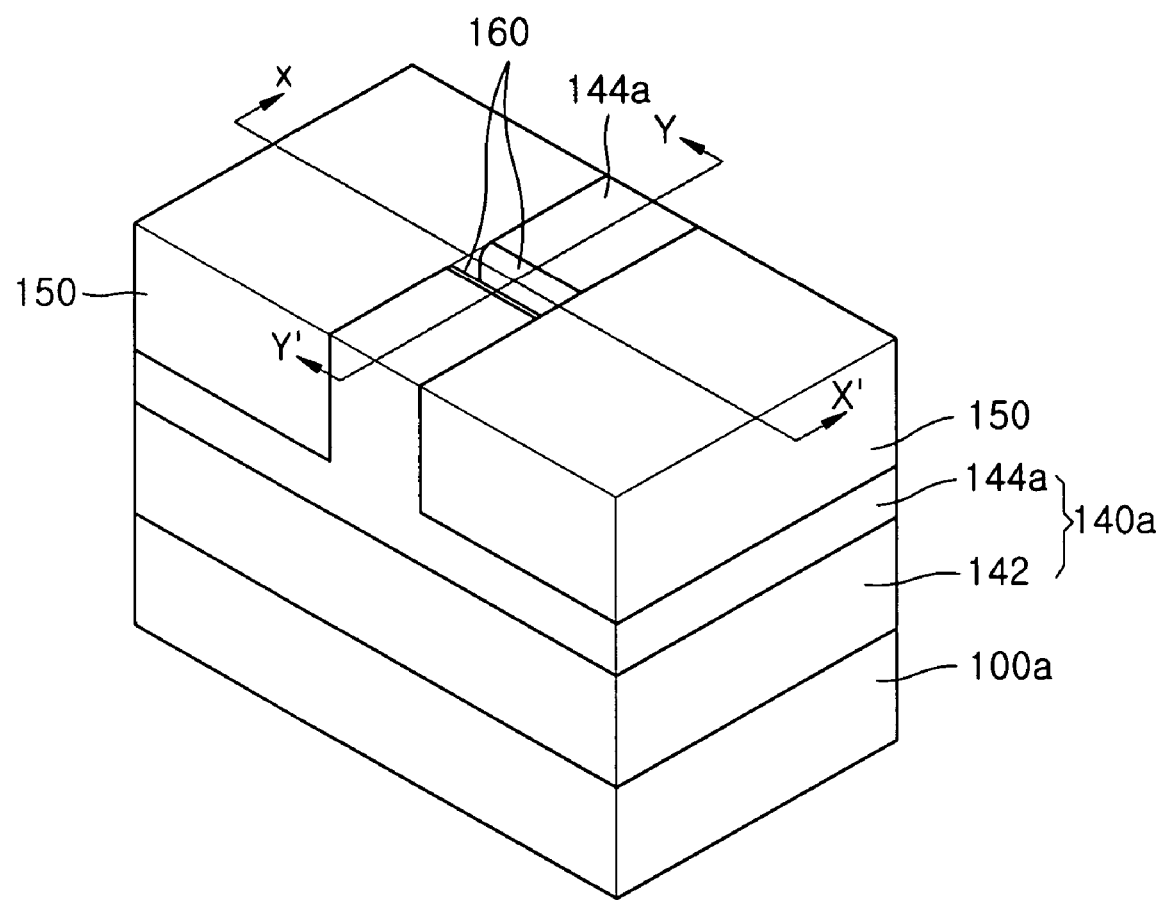
Figure 9B:
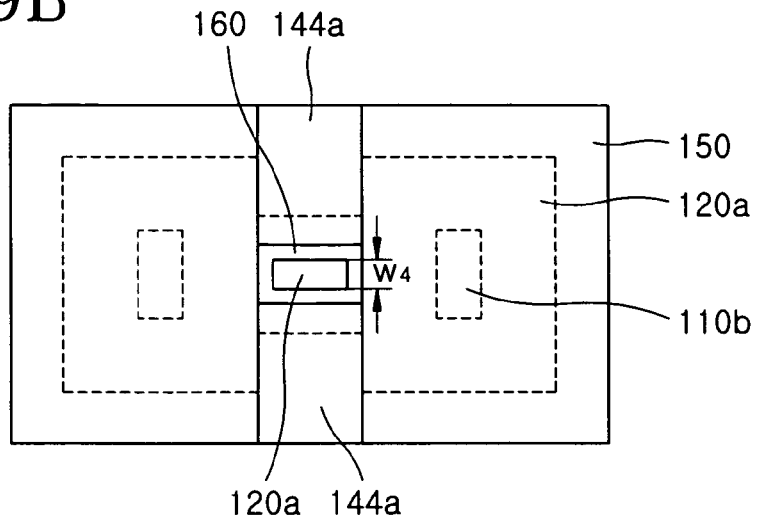
Figure 9C:
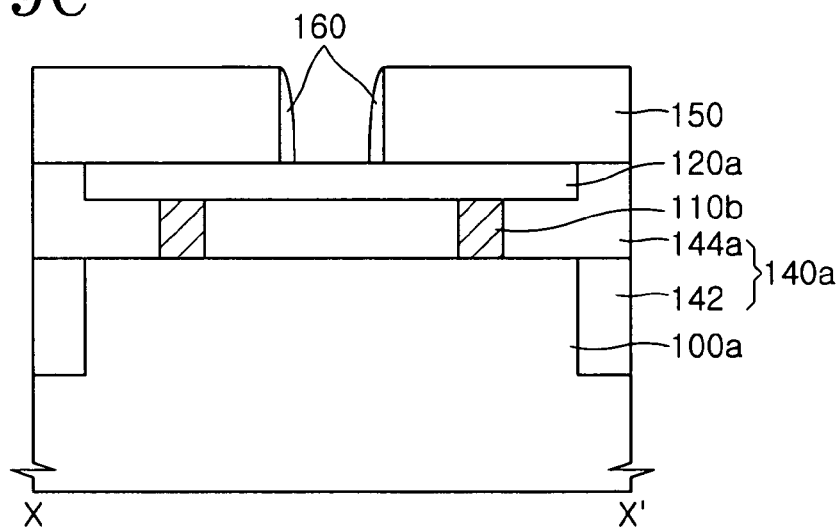
Figure 9D:
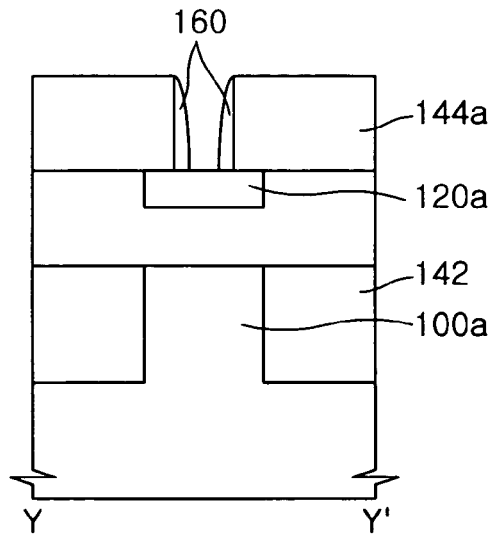
Figure 10A:
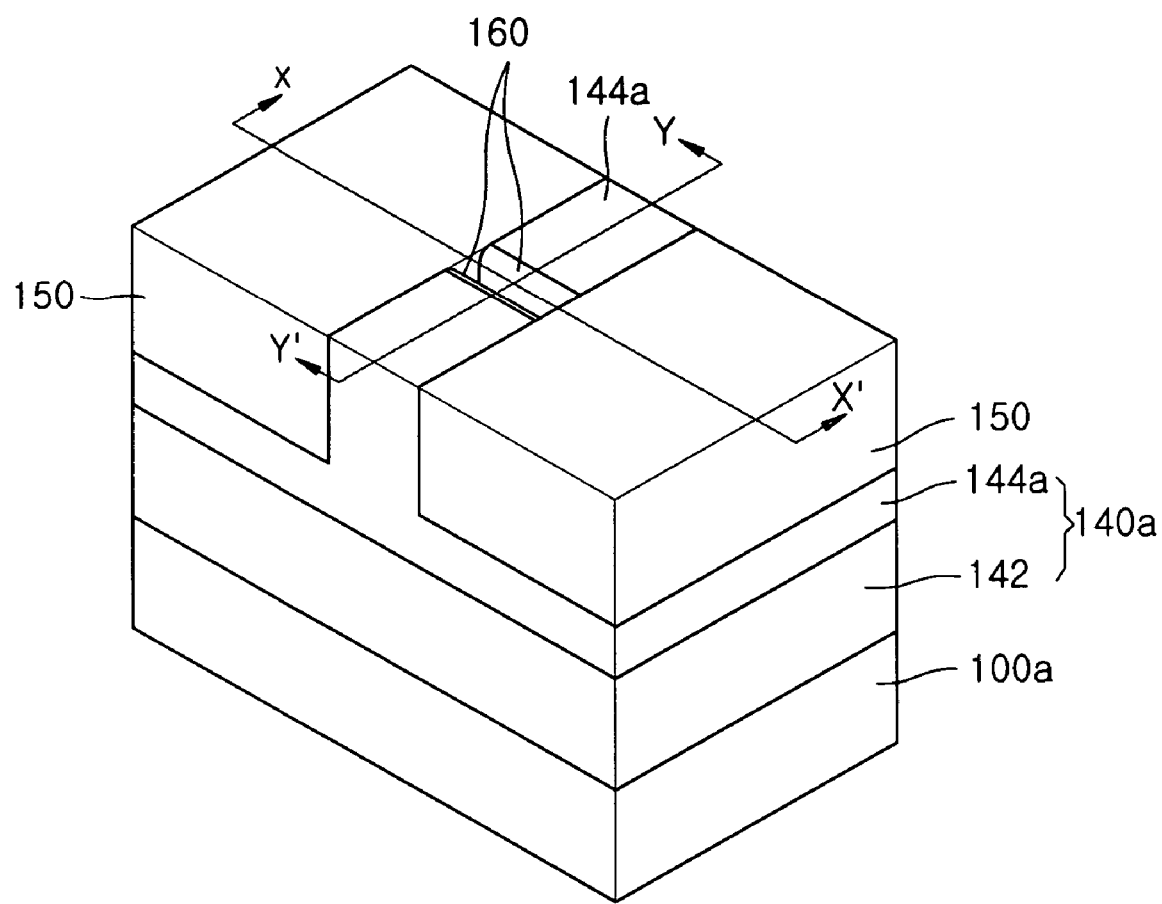
Figure 10B:
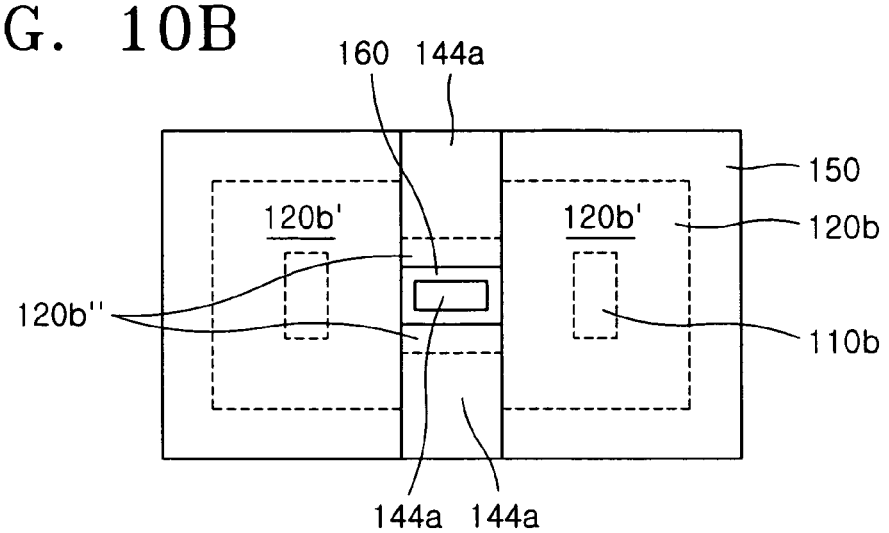
Figure 10C:
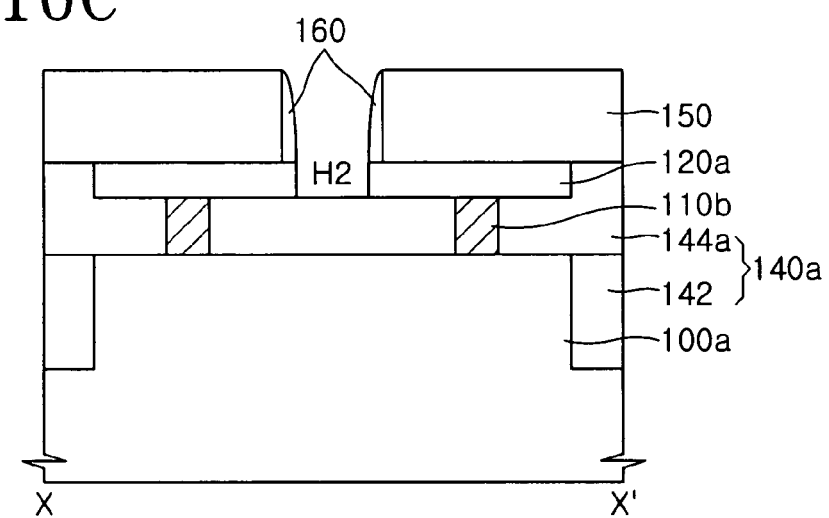
Figure 10D:
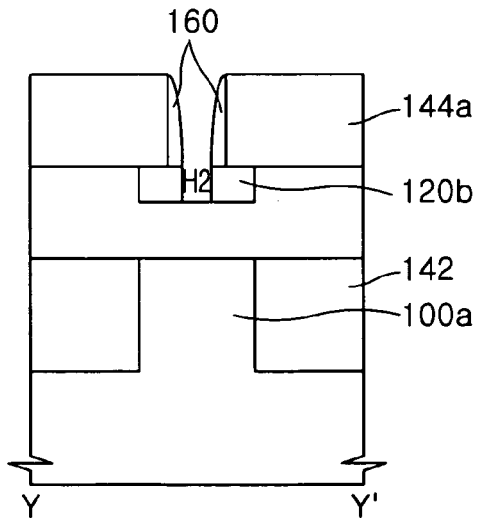

FIGS. 1, 2A, 3A, . . . , and 12A are perspective views illustrating exemplary operations for manufacturing a multi bridge channel field effect transistor (FET) including a plurality of nano-wire bridge channels according to some embodiments of the present invention; FIGS. 2B, 3B, . . . , and 12B are top views illustrating the operations illustrated in FIGS. 2A, 3A, . . . , and 12A, respectively; FIGS. 2C, 3C, . . . , and 12C are cross-sectional views taken along lines X-X' of FIGS. 2A, 3A, . . . , and 12A, respectively; and FIGS. 2D, 3D, . . . , 12D are cross-sectional views taken along lines Y-Y' of FIGS. 2A, 3A, . . . , and 12A, respectively.

Referring to FIG. 1, a stack of layers including a sacrificial layer 110 and a pre-active layer 120 are formed on the semiconductor substrate 100 at a location at which an active region is to be formed. The semiconductor substrate 100 may be a silicon germanium layer, a silicon-on-insulator (SOI) substrate, or a silicon germanium-on-insulator (SGOI) substrate, etc. The substrate 100 may be a single crystal silicon substrate.

The layers 110 and 120 may have a single-layer structure including one of each of the sacrificial layer 110 and the pre-active layer 120, as illustrated in FIG. 1. Alternatively, the stack of layers 110 and 120 may have a multi-layer structure in which multiple sacrificial layers 110 and pre-active layers 120 are alternately stacked. The sacrificial layer 110 may be formed of a material that has a high etch selectivity with respect to the semiconductor substrate 100. For example, the sacrificial layer 110 may be made of silicon germanium and have a thickness of about 20-50 nanometers, and the semiconductor substrate 100 may be made of silicon. The pre-active layer 120 may be made of a material that has a high etch selectivity with respect to the sacrificial layer 110. For example, the pre-active layer 120 may be made of silicon and have a thickness of about 20 nanometers or less. The silicon germanium sacrificial layer 110 and the silicon pre-active layer 120 may be formed using an epitaxial growth method, which may have a precise thickness control.

Still referring to FIG. 1, a mask layer 130, which will function as an etch mask, is formed on the pre-active layer 120. The mask layer 130 is used to define an active region, similar to a mask layer used in a conventional STI forming process. For example, the mask layer 130 may be a composite layer of a pad oxide layer 132 and a hard mask layer 134 made of a silicon nitride.

Referring to FIGS. 2A through 2D, a mask pattern 130a defining an active region is formed using a conventional photolithographic process. In the illustrated embodiments, the mask pattern 130a may include a pad oxide layer pattern 132a and a hard mask pattern 134a. The active-region-forming stack of layers 110 and 120 and the semiconductor substrate 100 are anisotropically etched using the mask pattern 130a as an etch mask, thereby forming an active-region-forming stack of patterns 110a and 120a and a trench T for forming a shallow trench isolation (STI) region on a semiconductor substrate 100a. The active-region-forming stack pattern 110a and 120a may include a sacrificial pattern 110a and a pre-active pattern 120a.

The mask pattern 130a defines the active region and has an H-shape (in plan view) in which a region 130a" disposed above a channel region 120a" between regions 130a' overlying source and drain regions 120a' is relatively narrower than the regions 130a'. That is, the mask pattern 130a is formed such that a width $w_2$ of the region 130a" disposed above the channel region 120a" is narrower than a width $w_1$ of the regions 130a' disposed above the source and drain regions 120a'. The region 130a" disposed above the channel region 120a" is formed with an appropriate length considering a design rule. The length of the region 130a" may be equal to or greater than the length of a desired final channel.

Referring to FIGS. 3A through 3D, the hard mask pattern 134a is isotropically etched by chemical dry etching or wet etching, thereby forming a second hard mask pattern 134b smaller than the hard mask pattern 134a. When the hard mask pattern 134a comprises silicon nitride, the etching may be performed using an etchant containing phosphoric acid or other suitable etchant. The etching of the hard mask pattern 134a narrows the region 130a" disposed above the channel region 120a" to a width $W_3$. If the mask pattern 130a is patterned such that the width $w_2$ of the region 130a" disposed above the channel region 120a" is sufficiently small, e.g., 100 nanometers or less, when forming the mask pattern 130a, the etching of the hard mask pattern 134a may be omitted. Alternatively, the hard mask pattern 134a can be etched after forming the mask pattern 130a and before anisotropically wet etching layers below the mask pattern 130a, i.e., the channel layer 120, the sacrificial layer 110, and the semiconductor substrate 100, using the mask pattern 130a as an etch mask. In such a case, the channel region 120a" of the pre-active pattern 120a can be narrower than that illustrated in FIGS. 3A through 3D.

Referring to FIGS. 4A through 4D, the sacrificial pattern 110a is selectively etched using isotropic etching, thereby forming a pair of active support patterns 110b. The active support patterns 110b are formed below the source and drain regions 120a' so as to support the source and drain regions 120a'. Thus, when the sacrificial pattern 110a is etched, a portion of the sacrificial pattern 110a disposed below the channel region 120a" is removed. Optionally, a photoresist pattern masking the regions 130a' may be further formed on a top surface of the mask pattern 130a above the source and drain regions 120a' before the selective etching of the sacrificial pattern 110a.

The sacrificial pattern 110a may be wet etched or chemical dry etched. The etching may be performed such that the sacrificial pattern 110a has an etch selectivity of at least 30 with respect to the semiconductor substrate 100a and the pre-active pattern 120a. When the semiconductor substrate 100, the pre-active pattern 120a, and the sacrificial pattern 110a comprise silicon, epitaxial silicon, and epitaxial silicon germanium, respectively, a mixture containing hydrogen peroxide ($H_2O_2$), hydrogen fluoride (HF), and acetic acid ($CH_3COOH$), a mixture containing ammonium hydroxide ($NH_4OH$), hydrogen peroxide ($H_2O_2$), and deionized water ($H_2O$), an etching solution containing peracetic acid, or another suitable etchant, may be used as an etching solution.

Referring to FIGS. 5A through 5D, a thick film of HDP oxide having an excellent gap filling property is deposited on the resultant structure of FIGS. 4A through 4D. The deposited HDP oxide film is planarized until the second hard mask pattern 134b is exposed. Thus, a trench filling-insulating layer 142 is formed, filling the trench T in the semiconductor substrate 100a and, simultaneously, a first buffer layer 144 which surrounds the active support patterns 110b, the pre-active pattern 120a, the pad oxide layer pattern 132a, and the second hard mask pattern 134b is formed.

Referring to FIGS. 6A through 6D, the first buffer layer 144 and the mask pattern 132a and 134b are etched using a conventional photolithographic process, thereby forming a dummy gate pattern 132b, 134c, and 144a which extends in a direction in which a gate line will be formed. Thus, two portions of the pre-active pattern 120a are exposed on either side of the dummy gate pattern 132b, 134c, and 144a. The exposed portions of the pre-active pattern 120a will serve as source and drain regions 120a'.

Referring to FIGS. 7A through 7D, a thick layer of an insulating material, such as medium temperature oxide (MTO), is deposited on the resultant structure of FIGS. 6A through 6D. The deposited insulating material is planarized until a top surface of the mask pattern 134c is exposed. Thus, a second buffer layer 150 which surrounds the dummy gate pattern 132b, 134c, and 144a is formed.

Referring to FIGS. 8A through 8D, the hard mask pattern 134c and the pad oxide layer pattern 132b are removed from the dummy gate pattern 132b, 134c, and 144a, thereby forming a first hole H1 which is surrounded by a first buffer pattern 144a and the second buffer layer 150. A portion of a top surface of the pre-active pattern 120a is exposed through the first hole H1. To form the first hole H1, an exposed portion of the hard mask pattern 134c, which comprises silicon nitride, may be removed using a phosphoric acid stripping method. Subsequently, an exposed portion of the pad oxide layer pattern 132b may be removed.

Referring to FIGS. 9A through 9D, a spacer 160 is formed on sidewalls of the first buffer pattern 144a and the second buffer layer 150 exposed through the first hole H1, using, for example, conventional techniques for forming a spacer. The spacer 160 reduces the width $W_4$ of the first hole H1 and defines a width $W_5$ (see FIG. 11B) of a channel. If an appropriate width of the channel is provided in the etching of the hard mask pattern 134a, the process of forming the spacer 160 can be excluded. However, when the etching is not performed, when the appropriate width of the channel is not ensured in the etching, or when the pre-active pattern 120a is formed after the etching, etc., the spacer 160 may be formed. The spacer 160 may be composed of silicon nitride.

Referring to FIGS. 10A through 10D, the exposed portion of the pre-active pattern 120a is etched using the spacer 160, the first buffer pattern 144a, and the second buffer layer 150 as a mask, thereby forming a second hole H2. A portion of the first buffer pattern 144a is exposed through the second hole H2. Dual channel regions 120b" are formed by dividing the channel region 120a".

Figure 11A:
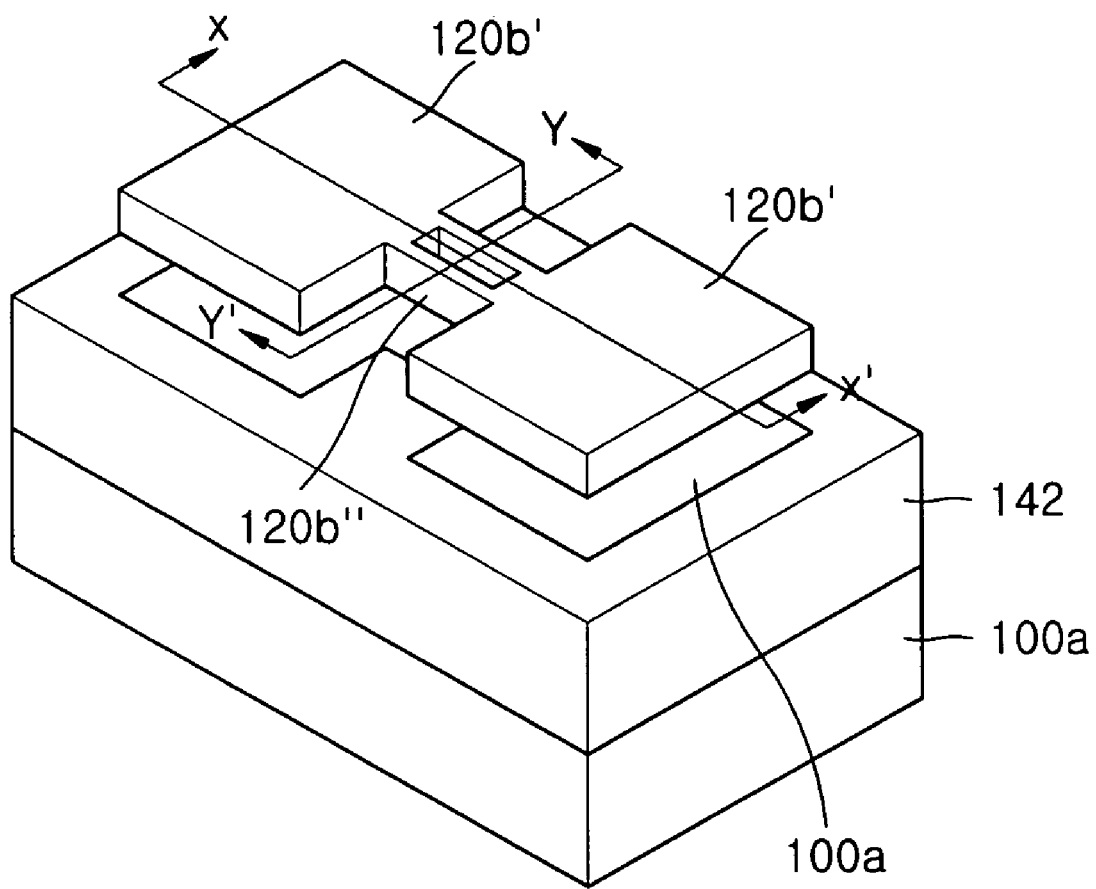
Figure 11B:
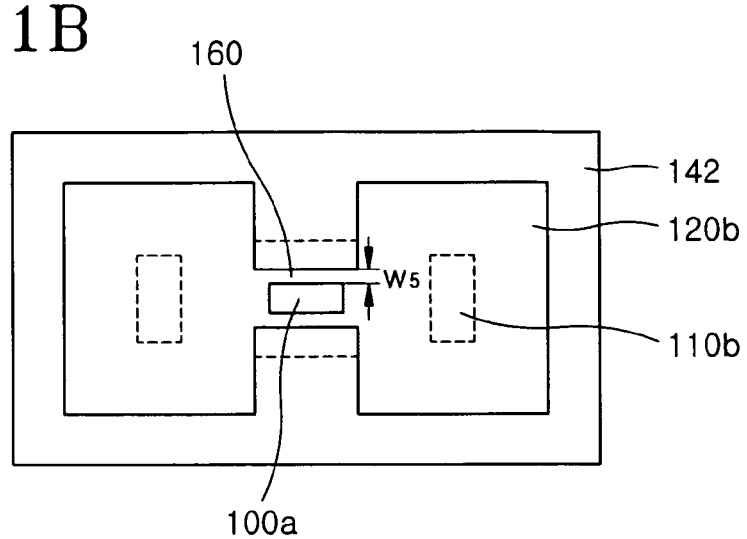
Figure 11C:
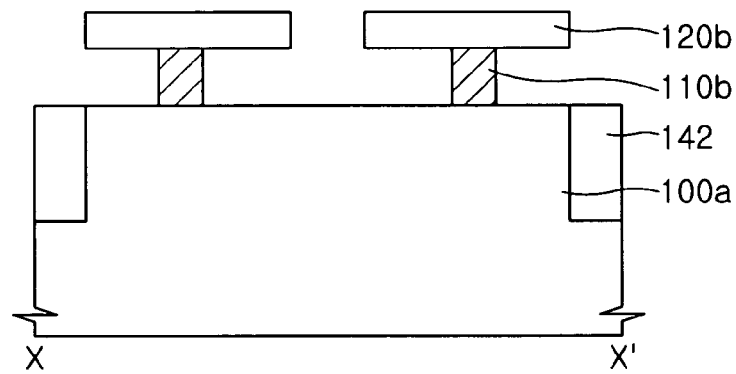
Figure 11D:
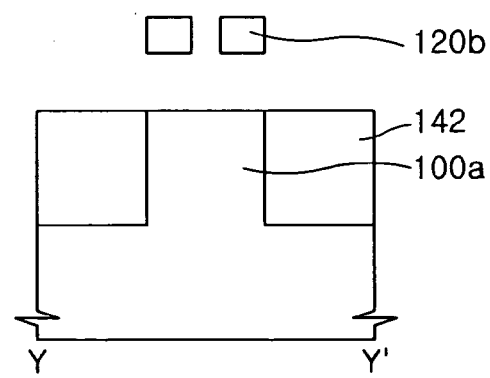
Figure 12A:
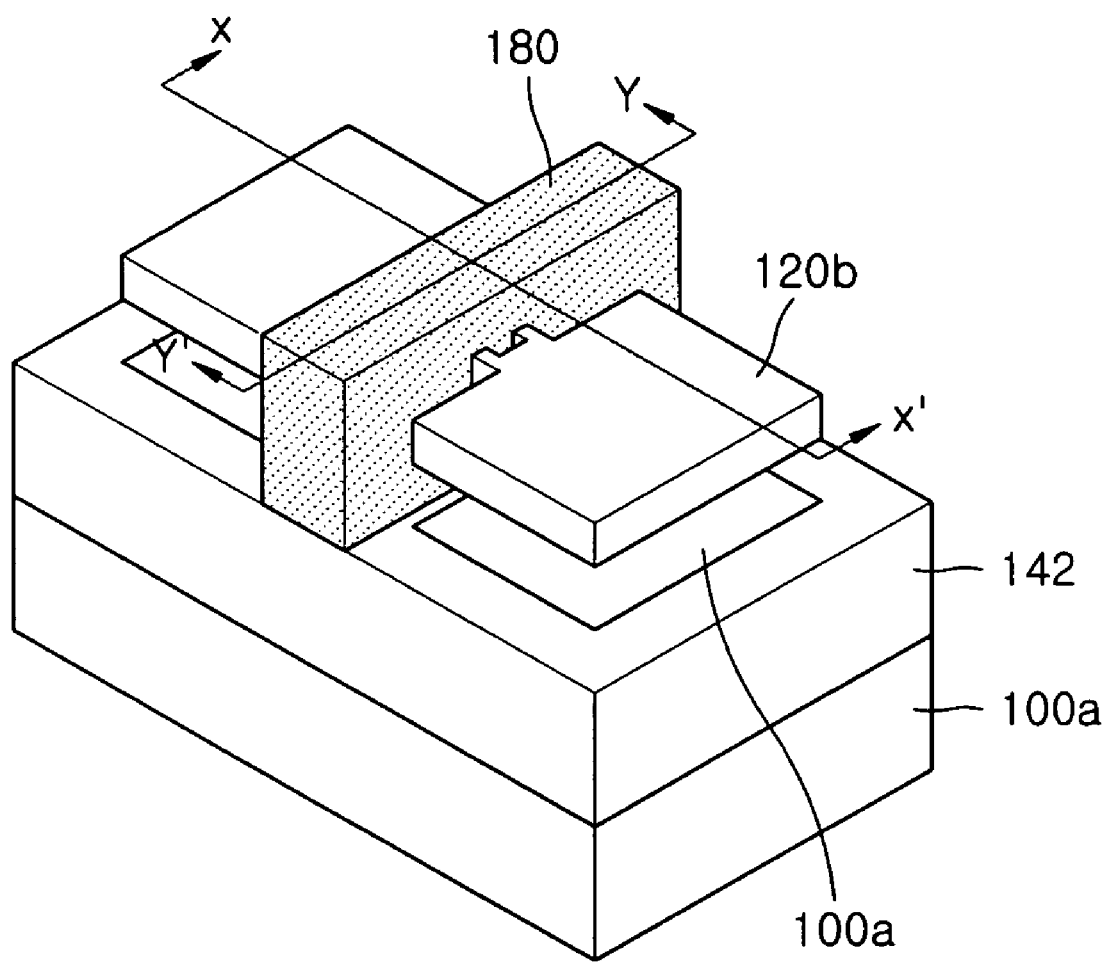
Figure 12B:
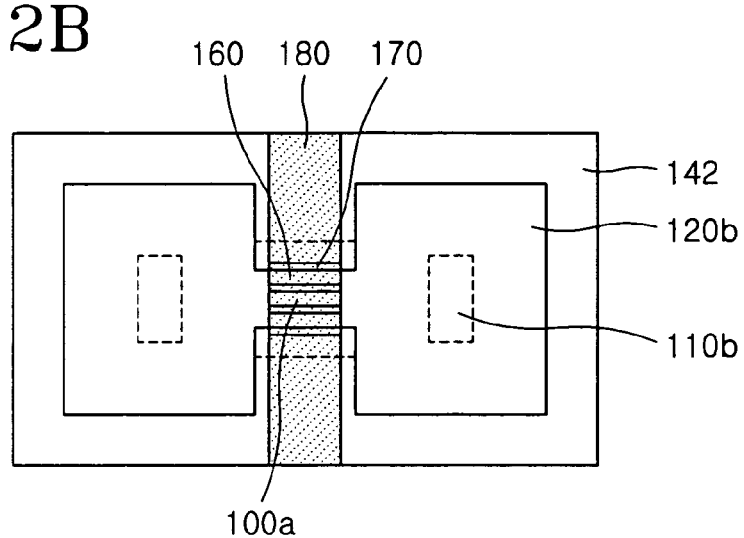
Figure 12C:
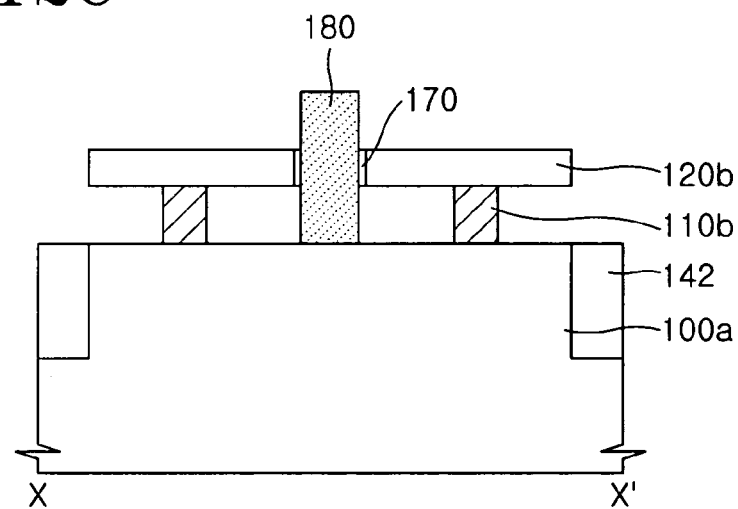
Figure 12D:
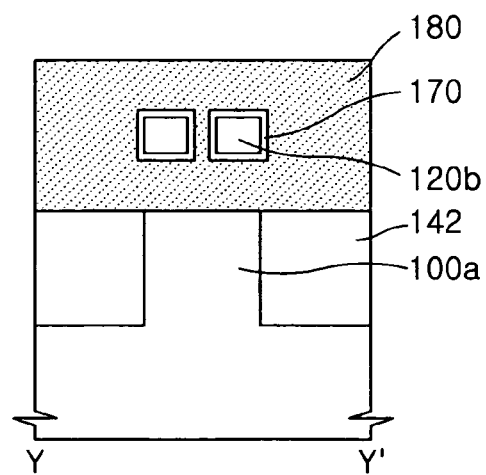

Referring to FIGS. 11A through 11D, the spacer 160 is removed. The first buffer pattern 144a and the second buffer layer 150 are removed using a conventional etching process until the trench-filling insulating layer 142 below the first buffer pattern 144a is exposed by controlling the removal conditions. As a result, the channel regions 120b" are supported by the active support patterns 110b, as illustrated in FIG. 11C.

Subsequently, the active pattern 120b may optionally be etched. The etching reduces the size of the channel regions 120b" of the active pattern 120b, such that the channel regions 120b" are very small wires. For example, when the pre-active layer 120 is formed to a thickness of about 20 nanometers, a thickness and/or a width of the channel regions 120b" can be reduced to about 10-15 nanometers by etching the active pattern 120b.

Subsequently, the active pattern 120b may optionally be subjected to a first annealing process. In the first annealing process, edges of the channel regions 120b" are rounded. It may be advantageous to perform the first annealing because, when the cross-sections of the channel regions 120b" have rounded shapes, for example, elliptic shapes, rather than rectangular shapes, a more uniform voltage may be applied to the channel patterns in all directions by a gate electrode and reliability of the semiconductor device and suitability for a subsequent process may be increased.

The first annealing process may be performed at a temperature that ensures that the cross-sections of the channel regions 120b" are circular. For example, when the first annealing is performed under a hydrogen atmosphere, the temperature may be about 600-1200° C. If the first annealing is performed under an argon atmosphere, the temperature may be about 900-1200° C. During the first annealing, the sizes of the cross-sections of the channel regions 120b" may be slightly reduced, but such a size reduction is may be small and thus, may be negligible.

Referring to FIG. 11A, the active pattern 120b comprises the pairs of source and drain patterns 120b' and the pair of channel patterns 120b", which are arranged in parallel. The channel patterns 120b" are interposed between the source and drain patterns 120b'. The channel patterns 120b" may be nano-wires. As used herein, the term "nano-wire" refers to a pattern having a small wire shape of which the cross-sectional width and height in a vertical direction are less than 20 nanometers. The source and drain patterns 120b' have the same thickness as the channel patterns 120b" and the source and drain patterns 120b' function as source and drain regions.

The lengths of the channel patterns 120b" may be set to an appropriate length by considering, for example, design rule. The cross-sectional shapes and/or sizes of the channel patterns 120b" may be set appropriately to ensure that electrical properties, especially current properties, of the FET can be improved.

According to some embodiments of the present invention, the cross-sections of the channel patterns 120b" may have appropriate cross-sectional shapes for forming isotropic channels. Such shapes include circles, ellipses, and rectangles in which the length and width are substantially identical. Because a gate electric potential can be substantially uniformly applied in all directions to the channel patterns 120b" having such shapes, carrier scattering may be reduced, and thus, the nano-wire channels may support large currents.

The widths and thicknesses of the channel patterns 120b" may be such that the channels can be completely depleted when a predetermined voltage is applied to a gate electrode. The widths and thicknesses can vary according to a gate voltage, characteristics and a thickness of a gate insulating layer, and a doping concentration of the channels. For example, when the thickness of an inversion layer is about 10 nanometers, as in a conventional flat transistor, the width and thickness of the channel patterns 120b" may be about 10-30 nanometers, preferably about 10-20 nanometers.

According to some embodiments of the present invention, the active pattern 120b has a single-layer structure, but is not limited thereto. As described above, the number of layers of the active pattern 120b may be increased by repeatedly stacking sacrificial layers 110 and pre-active layers 120 when forming the active region forming stack layer.

Referring to FIGS. 12A through 12D, to form gate insulating layers 170, the resultant structure of FIGS. 11A through 11D is subjected to a second annealing process under an oxygen or ozone atmosphere. When the second annealing is performed under an oxygen atmosphere, etc., silicon exposed on surfaces is oxidized to form silicon oxide layers 170. The temperature and period of the second annealing process can vary according to the desired thicknesses of the gate insulating layers 170. For example, the gate insulating layers 170 may be formed to a thickness of about 50-100 Å using the second annealing process. As a result of the second annealing process, a silicon oxide layer (not shown) can be incidentally formed on surfaces of the source and drain regions 120b' of the active pattern 120b.

Subsequently, a gate electrode 180 is formed on the gate insulating layers 170 between the source and drain regions 120b', i.e., on the gate insulating layers 170 surrounding the channel patterns 120b". The gate electrode 180 may be, for example, a single layer of polysilicon or a composite layer of a polysilicon film and a metal or metal silicide film. The resultant structure of FIGS. 12A through 12D may be subjected to a conventional process of manufacturing a semiconductor, thus obtaining a completed semiconductor device.

In MOS transistors according to various embodiments of the present invention, a wire channel may be completely surrounded by a gate electrode. Thus, the channel may be completely controlled by the gate electrode and, therefore, a short channel effect can be prevented. In addition, an inversion region may be formed on at least an outer surface of the wire channel. Consequently, a width of the channel may be increased, and thus a narrow width effect can be prevented.

A wire channel of a MOS transistor according to some embodiments of the present invention can be completely depleted and may have an isotropic structure. Thus, carriers can travel straighter without scattering. Consequently, high speed and/or high current operation of the transistor is possible. Furthermore, the number of wire channels can be easily increased and a MOS transistor according to embodiments of the present invention can be manufactured using conventional processes. Further, the source and drain regions may be separated from a bulk substrate, and thus, leakage current can be reduced. Thus, a MOS transistor that can operate at high speed and have high reliability may be manufactured.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above and what is conceptually equivalent.

What is claimed is:

1. A field effect transistor (FET) comprising:
    spaced apart source and drain regions disposed on a substrate;
    at least one pair of elongate channel regions disposed on the substrate and extending in parallel between the source and drain regions;
    a gate insulating region surrounding the at least one pair of elongate channel regions; and
    a gate electrode surrounding the gate insulating region and the at least one pair of elongate channel regions.

2. The FET of claim 1, further comprising support patterns interposed between the semiconductor substrate and the source and drain regions.

3. The FET of claim 1, wherein the elongate channel regions have sufficiently small cross-section to enable complete depletion thereof.

4. The FET of claim 3, wherein a width and a thickness of the elongate channel regions is in a range from about 10 nanometers to about 20 nanometers.

5. The FET of claim 1, wherein each of the elongate channel regions has an elliptical cross-section.

6. The FET of claim 1, wherein the at least one pair of elongate channel regions comprises a plurality of stacked pairs of elongate channel regions.

7. A method of manufacturing a FET, the method comprising:
    forming an active region on a substrate, the active region comprising spaced-apart source and drain regions and at least one pair of elongate channel regions extending in parallel therebetween;
    forming a gate insulating region surrounding the at least one pair of elongate channel regions; and
    forming a gate electrode surrounding the gate insulating region and the at least one pair of elongate channel regions.

8. The method of claim 7, wherein forming an active region comprises forming the source and drain regions and the at least one pair of elongate channel regions from the same semiconductor material layer.

9. The method of claim 7, wherein forming an active region comprises:
    forming a stack of layers comprising n sacrificial layers and n semiconductor layers alternately stacked on a semiconductor substrate;
    forming a mask pattern defining an active region on the stack of layers;
    etching the stack of layers using the mask pattern as an etch mask to form a stack of patterns including n sacrificial patterns and n semiconductor patterns, each of the sacrificial patterns and the semiconductor patterns comprising a narrow region extending between wider spaced-apart regions;
    etching the sacrificial patterns such that portions of the sacrificial patterns underlying narrow regions of the semiconductor patterns are removed and portions of the sacrificial patterns below the wider regions remain to form n pairs of active support patterns;
    forming a first buffer layer that surrounds the active support patterns, the semiconductor patterns and the mask pattern and that leaves an upper surface of the mask pattern exposed;
    patterning the mask pattern and the first buffer layer to form a dummy gate pattern exposing surfaces of the wider spaced-apart regions of one of the semiconductor patterns;
    forming a second buffer layer that surrounds the dummy gate pattern and leaves an upper surface of the dummy gate pattern exposed;
    removing the patterned mask pattern from the dummy gate pattern to form a hole exposing a top surface of the narrow region of the one of the semiconductor patterns; and
    etching the narrow region of the one of the semiconductor patterns through the hole to form a pair of elongate channel regions.

10. The method of claim 9, wherein n is 1 or 2.

11. The method of claim 9, wherein the sacrificial layers comprise single crystal silicon germanium and wherein the semiconductor layers comprise single crystal silicon.

12. The method of claim 9, wherein each of the semiconductor layers has a thickness in a range from about 15 nanometers to about 25 nanometers.

13. The method of claim 9, further comprising etching side surfaces of the mask pattern after the forming the stack of patterns.

14. The method of claim 9:
    wherein during the forming the stack of patterns, the semiconductor substrate is also etched using the mask pattern to form a trench in the semiconductor substrate; and
    wherein during the forming the first buffer layer, an insulating region is formed in the trench.

15. The method of claim 9, further comprising forming a sidewall spacer on a sidewall of the first buffer layer and the second buffer layer exposed through the hole after the forming the hole, and wherein etching the narrow region of the one of the semiconductor patterns through the hole to form a pair of elongate channel regions comprises etching the narrow region of the one of the semiconductor patterns through the hole to form the pair of elongate channel regions using the sidewall spacer as an etch mask.

16. The method of claim 15, wherein the first buffer layer and the second buffer layer comprise silicon oxide and the sidewall spacer comprises silicon nitride.

17. The method of claim 15, further comprising removing the sidewall spacer before the removing the second buffer layer and the patterned first buffer layer.

18. The method of claim 9, further comprising etching side surfaces of the pair of elongate channel regions before the forming the gate insulating layers.

19. The method of claim 9, further comprising thermally oxidizing the pair of elongate channel regions to round the pair of elongate channel regions before the forming the gate insulating layers.

* * * * *